(12) United States Patent
Yokomae et al.

(10) Patent No.: US 7,705,443 B2
(45) Date of Patent: Apr. 27, 2010

(54) SEMICONDUCTOR DEVICE WITH LEAD FRAME INCLUDING CONDUCTOR PLATES ARRANGED THREE-DIMENSIONALLY

(75) Inventors: Toshiyuki Yokomae, Matsumoto (JP); Katsumichi Ueyanagi, Matsumoto (JP); Eiji Mochizuki, Matsumoto (JP); Yoshinari Ikeda, Matsumoto (JP)

(73) Assignee: Fuji Electric Device Technology Co., Ltd. (JP)

( * ) Notice: Subject to any disclaimer, the term of this patent is extended or adjusted under 35 U.S.C. 154(b) by 0 days.

(21) Appl. No.: 11/872,867

(22) Filed: Oct. 16, 2007

(65) Prior Publication Data

US 2008/0150102 A1 Jun. 26, 2008

(30) Foreign Application Priority Data

Oct. 16, 2006 (JP) ............................. 2006-281694

(51) Int. Cl.
*H01L 23/48* (2006.01)
*H01L 23/52* (2006.01)
*H01L 23/495* (2006.01)
*H01L 29/40* (2006.01)

(52) U.S. Cl. ........................ 257/690; 257/666; 257/692; 257/693; 257/696; 257/735; 257/779; 257/784; 257/786; 257/E23.01; 257/E23.02; 257/E23.023; 257/E23.026

(58) Field of Classification Search ................ 257/666, 257/690, 692, 735, 779, 784, 786, 693, 696, 257/E23.01, E23.02, E23.023, E23.026
See application file for complete search history.

(56) References Cited

U.S. PATENT DOCUMENTS

| | | | | |
|---|---|---|---|---|
| 5,804,469 | A * | 9/1998 | Asano et al. ................ | 438/123 |
| 6,507,264 | B1 * | 1/2003 | Whitney ..................... | 337/159 |
| 6,796,024 | B2 * | 9/2004 | Katoh et al. ................ | 29/832 |
| 6,826,827 | B1 * | 12/2004 | Fjelstad ..................... | 29/830 |
| 7,005,731 | B2 * | 2/2006 | Jiang et al. ................. | 257/676 |
| 7,227,240 | B2 * | 6/2007 | Knapp et al. ............... | 257/531 |
| 7,230,321 | B2 * | 6/2007 | McCain ..................... | 257/666 |
| 7,470,939 | B2 * | 12/2008 | Mochida et al. ............ | 257/177 |
| 7,511,371 | B2 * | 3/2009 | Wallace ..................... | 257/692 |
| 2004/0061202 | A1 * | 4/2004 | Shim et al. ................. | 257/666 |
| 2008/0203548 | A1 * | 8/2008 | Sun et al. ................... | 257/672 |

FOREIGN PATENT DOCUMENTS

| JP | 2005-064441 A | 3/2005 |
|---|---|---|
| JP | 2005-116702 A | 4/2005 |

* cited by examiner

*Primary Examiner*—Ida M Soward
(74) *Attorney, Agent, or Firm*—Rossi, Kimms & McDowell LLP

(57) ABSTRACT

An electrical connection inside a semiconductor device is established by lead frames formed of plural conductor plates. The lead frames are disposed three-dimensionally so that the respective weld parts thereof are exposed toward a laser light source used in the laser welding. The laser welding is then performed by irradiating a laser beam. According to the above, welding can be performed readily in a reliable manner. The productivity of the semiconductor device and the manufacturing method of the semiconductor device can be thus enhanced. In addition, because the lead frames have the cooling effect, they have the capability of a heat spreader. It is thus possible to provide a semiconductor device and a manufacturing method of the semiconductor device with high productivity.

19 Claims, 15 Drawing Sheets

WELD PART

WELD PART

WELD PART

FIG. 16 *Prior Art*

SEMICONDUCTOR DEVICE WITH LEAD FRAME INCLUDING CONDUCTOR PLATES ARRANGED THREE-DIMENSIONALLY

CROSS-REFERENCE TO RELATED APPLICATION

This reference claims priority from Japanese Application JP 2006-281694 filed on Oct. 16, 2006, the contents of which are incorporated herein by reference.

BACKGROUND OF THE INVENTION

The present invention relates to a semiconductor device and a manufacturing method of the semiconductor device, and more particularly, to a semiconductor device manufactured with the use of the laser welding technique and a manufacturing method of the semiconductor device.

As a power converter, such as an industrial converter, a semiconductor device incorporating a semiconductor element, such as an IGBT (Insulated Gate Bipolar Transistor), has been used (for example, see JP-A-2005-116702). FIG. 16 is a schematic cross section of the major portion of a semiconductor device. In a semiconductor device 100, a Cu (copper) base 102 is joined to the bottom of an insulating substrate 101 via a solder 103, and a resin case 105 molded to enclose an IGBT element 104 is bonded to the Cu (copper) base 102 along the upper edge 102a thereof.

An emitter terminal 106 and a collector terminal 107 serving as external connection terminals are provided to the inner wall of the resin case 105, and electrically connected to a circuit pattern 110 formed by the DCB (Direct Copper Bonding) method on the insulating substrate 101 via plural aluminum wires 108 and 109, respectively.

Although it is not shown in the drawing, the surface electrode of the IGBT element 104 is formed by aluminum (Al) deposition. However, because Au-plating processing is applied onto the uppermost surface, solder joining is enabled. A heat spreader 111 is joined to the surface electrode positioned on the top surface of the IGBT element 104 via a solder 112. In other words, the heat spreader 111 is connected to an emitter electrode formed on the surface of the IGBT element 104. One ends of aluminum wires 113 are attached to the top surface of the heat spreader 111 by bonding, and the other ends thereof are connected to the circuit pattern 110 formed on the insulating substrate 101. An emitter current thus flows into the circuit pattern 110 from the heat spreader 111 via the aluminum wires 113.

A collector electrode is formed on the bottom surface of the IGBT element 104 and connected to the circuit pattern 110 on the insulating substrate 101 via a solder 114. Although it is not shown in the drawing, a gate electrode is also formed on the surface of the IGBT element 104, and an aluminum wire 115a to electrically connect the gate electrode to the circuit pattern 110 is attached to the gate electrode by bonding. Further, an aluminum wire 115b extends from a portion corresponding to the circuit pattern 110 that is electrically connected to the gate electrode, and the tip end thereof is connected to an unillustrated gate terminal provided to the inner wall of the resin case 105.

Furthermore, in order to protect the IGBT element 104 and other elements inside the resin case 105 from moisture, humidity, dust, and so forth, the inside of the resin case 105 is encapsulated with gel 116.

As has been described, bonding using the wires is performed to ensure electrical connections among respective portions in the semiconductor device 100 incorporating the IGBT element 104 and the like.

In the semiconductor device 100 as is shown in FIG. 16, because the emitter current and the collector current have a large current capacity, it is necessary to increase the number of aluminum wires 108, 109, and 113 for the currents of a large capacity to flow at a time. However, because individual wires have to be welded one by one, there arises a problem that the manufacturing process takes too long a time.

In addition, in order to achieve downsizing and greater packaging density, respective members forming a semiconductor device are disposed intricately in a semiconductor device in recent years. Moreover, because the number of wires increases with an increase in capacity of the semiconductor device, there is another problem that it takes considerable time and labor until the bonding of all the wires is completed.

SUMMARY

The invention was devised in view of the foregoing, and therefore has an object to provide a semiconductor device and a manufacturing method of the semiconductor device achieving high productivity with the use of a simple and reliable welding method.

In order to solve the problems discussed above, in an aspect of the invention, a semiconductor device incorporating at least one semiconductor element is configured in such a manner that an electrical connection inside the semiconductor device is established by plural conductor plates, and that the plural conductor plates are disposed three-dimensionally so that respective weld parts provided to the plural conductor plates are exposed toward a laser light source used in laser welding.

According to the semiconductor device as above, in a semiconductor device incorporating at least one semiconductor element, an electrical connection inside the semiconductor device is established by plural conductor plates. These plural conductor plates are disposed three-dimensionally so that respective weld parts provided to the plural conductor plates are exposed toward the laser light source used in the laser welding.

Also, in another aspect of the invention, a manufacturing method of a semiconductor device incorporating at least one semiconductor element and establishing an electrical connection inside the semiconductor device by laser welding of plural conductor plates includes: disposing the plural conductor plates three-dimensionally so that respective weld parts provided to the plural conductor plates are exposed toward a laser light source used in the laser welding; and irradiating a laser beam to the respective weld parts.

According to the manufacturing method of the semiconductor device as above, in a manufacturing method of a semiconductor device incorporating at least one semiconductor element and establishing an electrical connection inside the semiconductor device by laser welding of plural conductor plates, the plural conductor plates are disposed three-dimensionally so that respective weld parts provided to the plural conductor plates are exposed toward the laser light source used in the laser welding, and a laser beam is irradiated to the respective weld parts.

In this embodiment, in a semiconductor device incorporating at least one semiconductor element, an electrical connection inside the semiconductor device is established by plural conductor plates, and these plural conductor plates are disposed three-dimensionally so that the respective weld parts provided to the plural conductor plates are exposed toward the laser light source used in the laser welding.

Also, in this embodiment, in a manufacturing method of a semiconductor device incorporating at least one semiconductor element and establishing an electrical connection inside the semiconductor device by laser welding of plural conductor plates, the plural conductor plates are disposed three-dimensionally so that the respective weld parts provided to the plural conductor plates are exposed toward the laser light source used in the laser welding, and a laser beam is irradiated to the respective weld parts.

According to the semiconductor device and the manufacturing method of the semiconductor device described as above, it is possible to achieve a semiconductor device and a manufacturing method of the semiconductor device with high productivity, with and by which the welding can be performed readily in a reliable manner.

BRIEF DESCRIPTION OF THE DRAWINGS

The invention will be described in greater detail with reference to certain preferred embodiments thereof, it will be understood, however, that modifications and variations are possible within the scope of the appended claims:

FIG. 16 is a schematic cross section of the major portion of a semiconductor device.

DESCRIPTION OF THE PREFERRED EMBODIMENTS

Hereinafter, one embodiment of the invention will be described in detail with reference to the drawings. In this embodiment, a three-phase inverter incorporating IGBT elements and FWD (Free Wheeling Diode) elements will be described as an example of a semiconductor device.

Figure 1A:
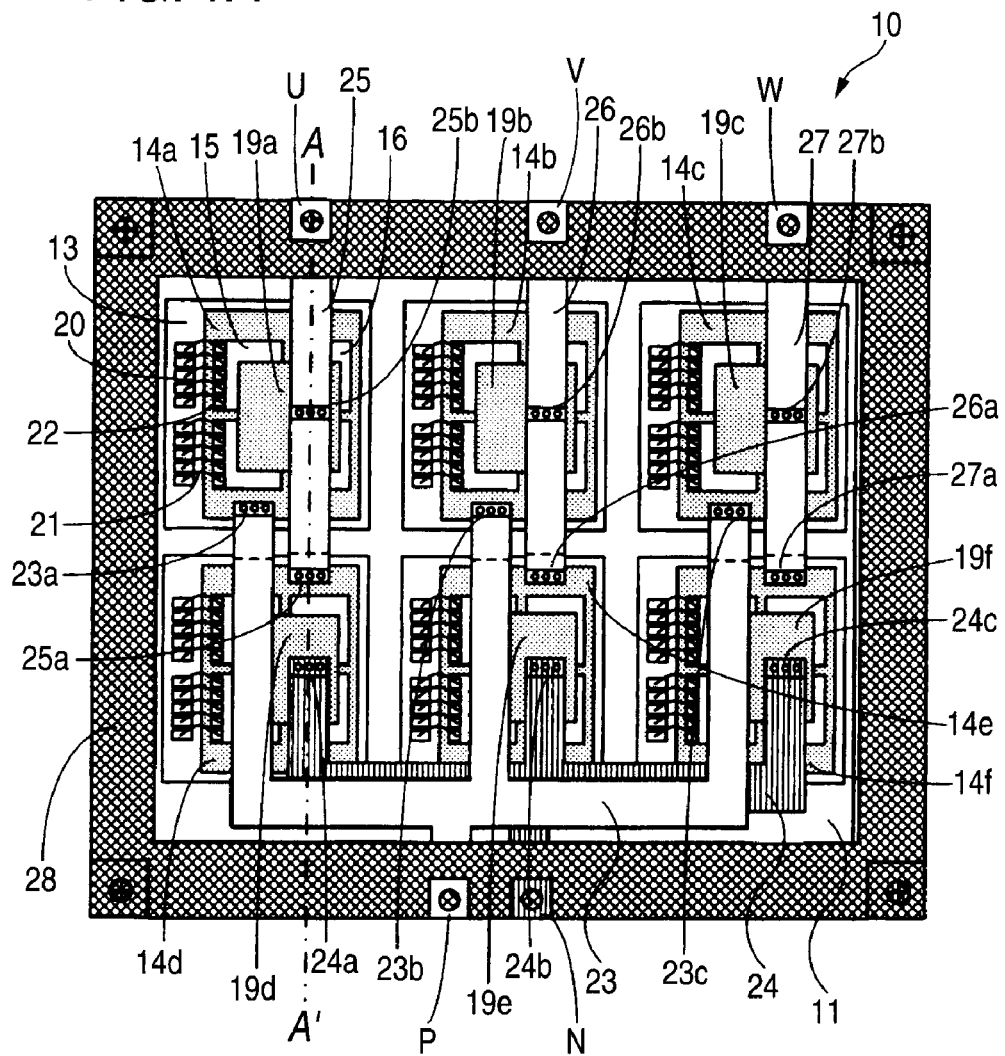
FIGS. 1A and 1B are schematic views of the major portion of a semiconductor device, FIG. 1A being a schematic top view of the major portion and FIG. 1B being a schematic cross section of the major portion.
Figure 1B:
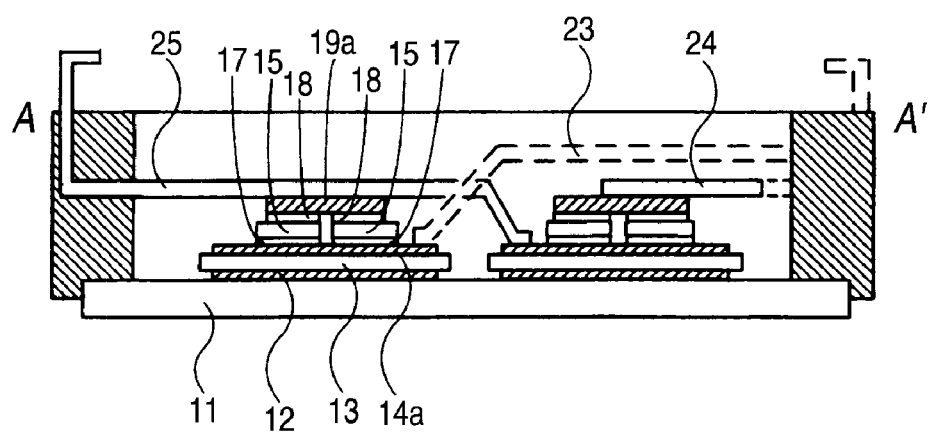

FIGS. 1A and 1B are schematic views of the major portion of the semiconductor device. FIG. 1A is a schematic top view of the major portion and FIG. 1B is a schematic cross section of the major portion. Herein, FIG. 1B corresponds to the position of the cross section taken along line A-A' in FIG. 1A. In these drawings, external extraction lead pins for the electrode that are used to control the semiconductor element and provided to a resin case 28 are omitted. The lead pins will be described below.

The semiconductor device 10 has a Cu foil 12 (not shown in FIG. 1A) soldered onto a Cu base 11, and an insulting substrate 13 joined onto the Cu foil 12 by the DCB method. A Cu foil 14a joined also by the DCB method is formed on the insulating substrate 13. IGBT elements 15 and FWD elements 16 are mounted on the Cu foil 14a via solders 17. The Cu foil 14a secures electrical connections to the collector electrode of each IGBT element 15 and to each FWD element 16 on the cathode side. A heat spreader 19a is joined onto the IGBT elements 15 and the FWD elements 16 via solders 18. The heat spreader 19a secures electrical connections to the emitter electrode of each IGBT element 15 and to each FWD element 16 on the anode side. Terminals 20 (not shown in FIG. 1B) are formed on the insulating substrate 13, and external extraction lead pins (not shown) for the electrode that control the corresponding IGBT element 15 are laser welded to the surfaces of the terminals 20.

Aluminum wires 21 are attached by bonding to the terminals 20 to which the lead pins are laser welded. Electrode terminals 22 that control the corresponding IGBT element 15 and the terminals 20 are electrically connected to each other by the aluminum wires 21.

A lead frame 23 formed of a conductor plate is disposed as an interconnection that connects a three-phase inverter circuit and a DC power supply (positive electrode). One end of the lead frame 23 derived to the outside serves as a positive input terminal (P). Parts 23a, 23b, and 23c of the lead frame 23 are weld parts and laser welded to the top surfaces of Cu foils 14a, 14b, and 14c, respectively. Further, a lead frame 24 is disposed under (lower layer) the lead frame 23 as an interconnection that connects the three-phase inverter circuit and the DC power supply (negative electrode). The lead frame 24 is disposed to be parallel to the lead frame 23 for P bus bar. One end of the lead frame 24 derived to the outside serves as a negative input terminal (N). Parts 24a, 24b, and 24c of the lead frame 24 are weld parts and laser welded to the top surfaces of heat spreaders 19d, 19e, and 19f, respectively.

Likewise, a lead frame is used as an interconnection serving as an AC output conductor. For example, for a U-phase lead frame 25, the weld part 25a of the lead frame 25 is laser welded to the top surface of the Cu foil 14d and the weld part 25b thereof is laser welded to the top surface of the heat spreader 19a. For a V-phase lead frame 26, the weld part 26a of the lead frame 26 is laser welded to the top surface of the Cu foil 14e and the weld part 26b thereof is laser welded to the top surface of the heat spreader 19b. For a W-phase lead frame 27, the weld part 27a of the lead frame 27 is laser welded to the top surface of the Cu foil 14f and the weld part 27b thereof is laser welded to the top surface of the heat spreader 19c.

The lead frames 23 through 27 and unillustrated lead pins are preformed integrally with the resin case 28, and the weld parts are positioned by placing the resin case 28 on the Cu base 11. The weld parts are then welded successively in the laser welding step.

The lead frames 23 through 27 are made of, for example, Cu and the thickness thereof is 0.3 to 1.5 mm. The width thereof is 2 to 50 mm. Regarding the structures, they are formed to have a planar shape while parts of the lead frames 23, 25, 26, and 27 are inclined, for example including inclined structures 23i, 25i, 26i, and 27i, so that they are disposed three-dimensionally.

As has been described, the semiconductor device 10 incorporates at least one semiconductor element (IGBT element 15 or FWD element 16) and electrical connections inside the semiconductor device 10 are established by plural conductor plates. In a case where laser welding is performed, the plural conductor plates are disposed three-dimensionally in such a manner that the weld parts 23a, 23b, 23c, 24a, 24b, 24c, 25a, 25b, 26a, 26b, 27a, and 27b of the lead frames 23 through 27 formed of the plural conductor plates are exposed toward the laser light source. In other words, the weld parts 23a, 23b, 23c, 24a, 24b, 24c, 25a, 25b, 26a, 26b, 27a, and 27b are disposed so as not to be covered with any other conductor plate.

At least one of the plural conductor plates is an output conductor of the semiconductor device 10, and it is laser welded to at least one of the electrode of the semiconductor element and the circuit pattern of the substrate on which the semiconductor element is mounted. Further, at least one of the plural semiconductor plates is an input conductor of the semiconductor device 10, and it is laser welded to at least one of the electrode of the semiconductor element and the circuit pattern of the substrate on which the semiconductor element is mounted. The electrode disposed on top of the semiconductor element is a heat spreader joined to the electrode layer of the semiconductor element.

According to the structure as above, because the respective weld parts 23a, 23b, 23c, 24a, 24b, 24c, 25a, 25b, 26a, 26b, 27a, and 27b provided to the lead frames 23 through 27 are exposed toward the laser light source, when the laser welding step is performed, the laser welding steps for the respective weld parts can be performed continuously as a single step. More specifically, because a step, such as the step of disposing another conductor plate, is not performed in the middle of the laser welding step, the welding can be performed readily in a reliable manner, which in turn makes it possible to achieve a semiconductor device with high productivity.

According to the three-dimensional arrangement of the lead frames 23 through 27 as above, because there is no need to form a circuit pattern connected by wire bonding as in the related art, the size of a module can be reduced.

Because the lead frames 23 through 27 have the capability of a heat spreader, it is possible to spread heat generated in association with an increase in capacity of the semiconductor device via the lead frames. In addition, because the lead frame 23 for P bus bar and the lead frame 24 for N bus bar are disposed in parallel with each other, magnetic fields induced by the currents are canceled out with each other and the inductance is reduced. As a result, because a large surge voltage will not be applied, a malfunction of the circuit can be prevented, which can in turn prevent damages to the semiconductor element.

The fabrication sequence of the semiconductor device 10 described above will now be described. FIG. 2A through FIG. 5B are views of the major portion used to describe the fabrication sequence of the semiconductor device 10.

Figure 2A:
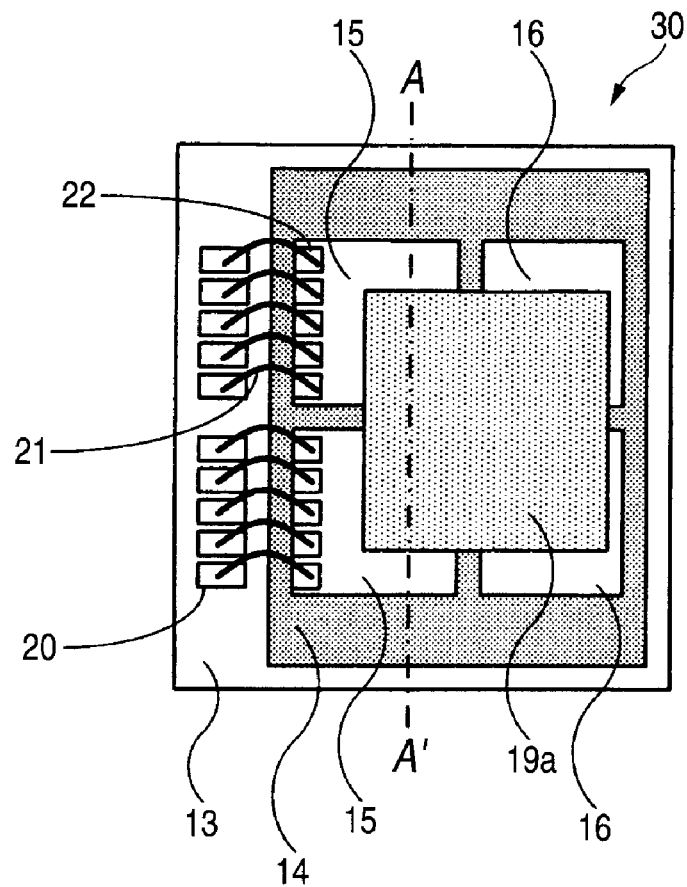
FIGS. 2A and 2B are schematic views of the major portion used to describe a power cell fabrication sequence, FIG. 2A being a schematic top view of the major portion of a power cell and FIG. 2B being a schematic cross section of the major portion of the power cell.
Figure 2B:
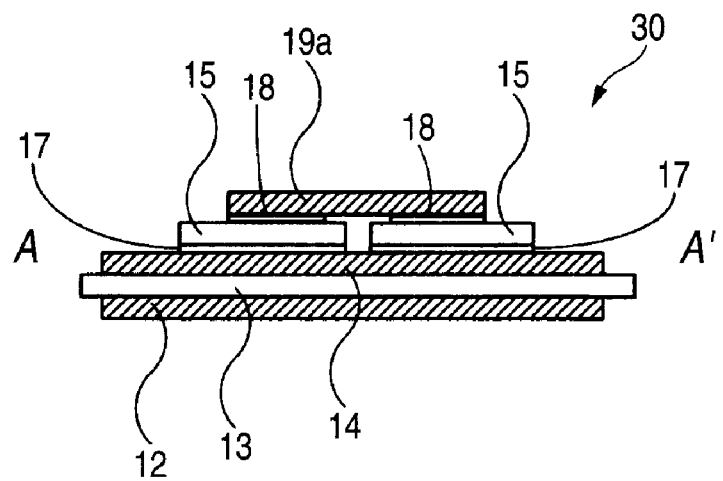

FIGS. 2A and 2B are schematic views of the major portion used to describe a power cell fabrication sequence. FIG. 2A is a schematic top view of the major portion of the power cell and FIG. 2B is a schematic cross section of the major portion of the power cell. Herein, FIG. 2B corresponds to the position of the cross section taken along line A-A' in FIG. 2A.

A Cu foil 14 that will be made into the Cu foil 12 and the circuit pattern is joined to the insulating substrate 13 of a specific size by the DCB method. Subsequently, two IGBT elements 15 and two FWD elements 16 are soldered onto the Cu foil 14 via the solders 17. The heat spreader 19a is soldered onto the IGBT elements 15 and the FWD elements 16 via the solders 18. In this state, the Cu foil 14 is electrically connected to the collector electrodes of the IGBT elements 15 and to the FWD elements 16 on the cathode side. Also, the heat spreader 19a is electrically connected to the emitter electrodes of the IGBT elements 15 and to the FWD elements 16 on the anode side.

Subsequently, the terminals 20 preformed on the insulating substrate 13 and the control electrode terminals 22 formed on the IGBT elements 15 are attached to each other by bonding using the aluminum wires 21. This bonding is performed, for example, by the ultrasonic joining method. As with the Cu foil 14, the terminals 20 can be preformed by the DCB method. Power cells 30 each having two IGBT elements 15 and two FWD elements 16 are thus completed.

Figure 3:
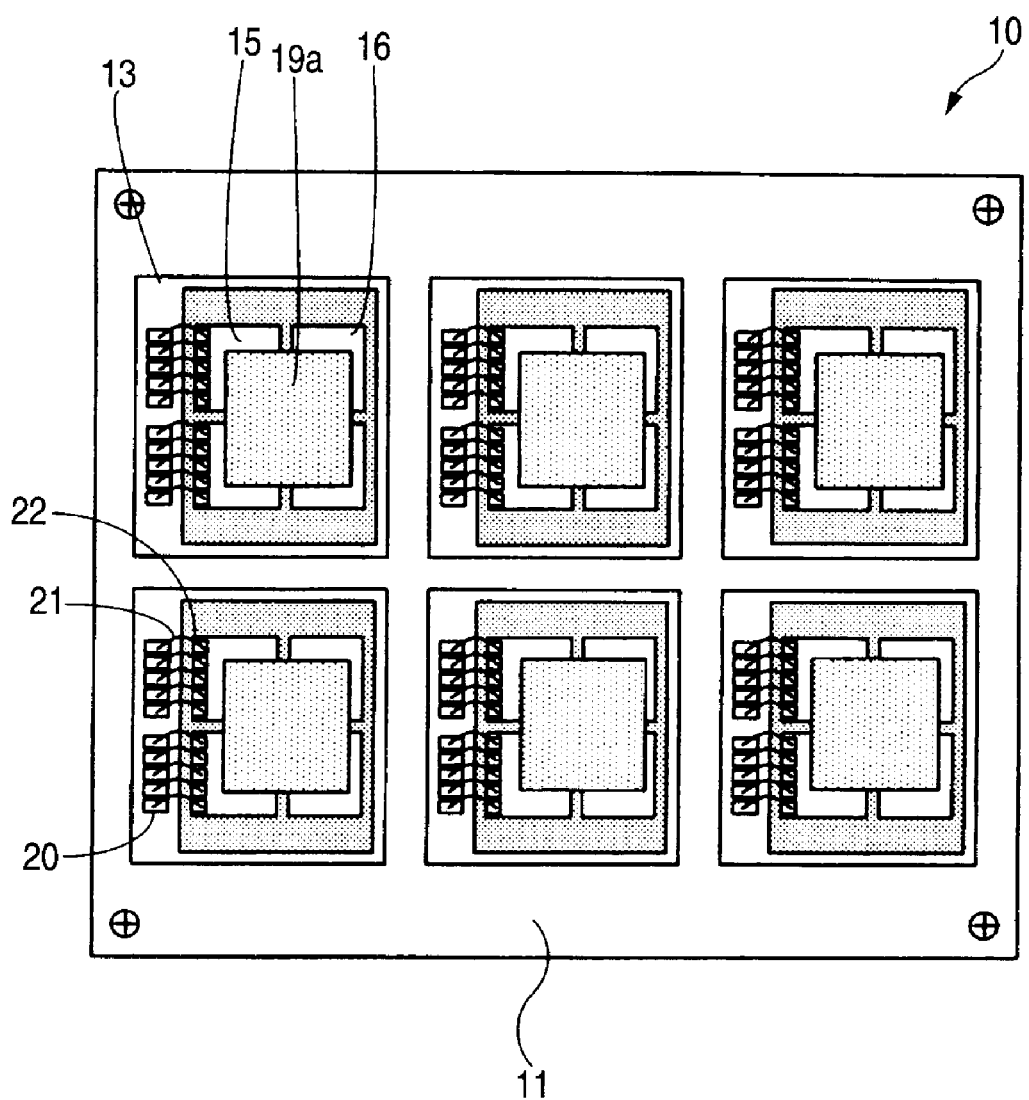
FIG. 3 is a schematic top view of the major portion used to describe a step of mounting power cells on a Cu base.

FIG. 3 is a schematic top view of the major portion used to describe the step of mounting the power cells on the Cu base. Six power cells 30 described above are mounted on the Cu base 11 by soldering. At this stage, the semiconductor device 10 incorporating no lead frames is manufactured.

Figure 4A:
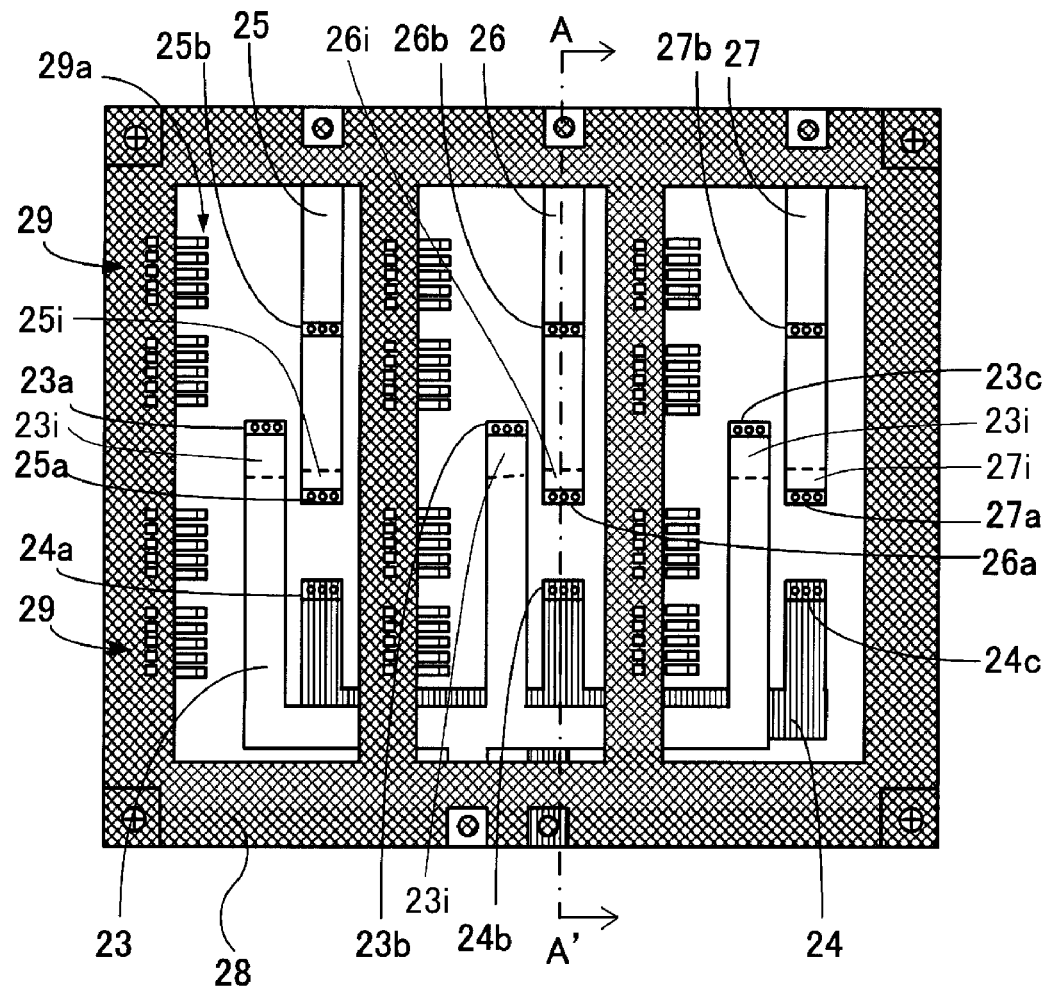
FIGS. 4A and 4B are schematic views of the major portion used to describe the structure of a resin case, FIG. 4A being a schematic top view of the major portion and FIG. 4B being a schematic cross section of the major portion.
Figure 4B:
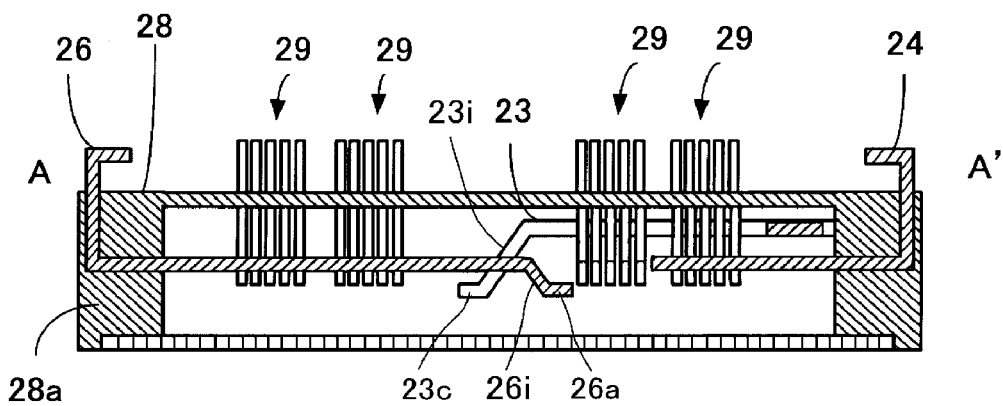

The structure of the resin case provided with lead frames that will be fit into the semiconductor device 10 incorporating no lead frames described above will now be described. FIGS. 4A and 4B are schematic views of the major portion used to describe the structure of the resin case. FIG. 4A is a schematic top view of the major portion and FIG. 4B is a schematic cross section of the major portion. Herein, FIG. 4B corresponds to the position of the cross section taken along line A-A' in FIG. 4A.

As are shown in these drawings, the lead frames 23 through 27 described above are encapsulated integrally with the corresponding side surfaces of the resin case 28 by die molding so as to fix the position of each. In particular, parts of the lead frames 23 and 24 are fixed to the side wall 28a of the resin case 28 by resin so that they are parallel to each other.

Likewise, parts of lead pins 29 formed of conductor plates are encapsulated integrally with the top surface of the resin case 28 by die molding so as to fix the position of each. The lead pins 29 are laser welded to the terminals 20 shown in FIG. 1A. In other words, the lead pins 29 are electrically connected to the terminals 20 that are electrically connected to the control electrode terminals 22 of the IGBT elements 15 via the aluminum wires 21. The lead pins 29 are made of, for example, Cu and have the thickness of 0.3 to 1.5 mm and the width of 1 to 5 mm. Besides Cu, brass or phosphor bronze is also applicable for the lead pins 29.

In this manner, the resin case 28 is integrated with the lead frames 23 through 27 and the lead pins 29 while maintaining the three-dimensional arrangement of the lead frames 23 through 27 and the lead pins 29, thereby fixing these members. In other words, because the positions of the respective weld parts 23a, 23b, 23c, 24a, 24b, 24c, 25a, 25b, 26a, 26b, 27a, 27b, and 29a provided to the lead frames 23 through 27 and lead pins 29 are determined in advance by the resin case 28, there is no need for jigs to hold the lead frames 23 through 27 and the lead pins 29 at the time of welding.

In addition, parts of the fixed lead frames 23, 25, 26, and 27 and lead pins 29 other than the weld parts have an inclined structure (a description for the lead pins 29 will be given below). The respective weld parts 23a, 23b, 23c, 24a, 24b, 24c, 25a, 25b, 26a, 26b, 27a, 27b, and 29a of the lead frames 23 through 27 and lead pins 29 are processed so as to be parallel to the insulting substrate 13 (this direction is defined as the horizontal direction). In this embodiment, in order to dispose the lead frames 23 through 27 and the lead pins 29 three-dimensionally, parts uprising from the horizontal direction are formed not to rise up vertically from the horizontal direction, and instead, they are formed to have an inclined structure. The angle of inclination of the inclined structure will be described below.

Hence, by bringing the respective weld parts of 23a, 23b, 23c, 24a, 24b, 24c, 25a, 25b, 26a, 26b, 27a, 27b, and 29a of the lead frames 23 through 27 and lead pins 29 into contact with welded parts, a specific load is applied to the welded parts due to the spring effect of the lead frames 23, 25, 26, and 27. As a result, when the welding is performed, the welding can be performed in a reliable manner without the weld parts 23a, 23b, 23c, 24a, 24b, 24c, 25a, 25b, 26a, 26b, 27a, 27b, and 29a and the welded parts moving apart from each other.

Also, according to the inclined structure as above, there can be achieved a capability of preventing parts of the lead frames 23 through 27 and the lead pins 29 other than the weld parts from being irradiated by a laser beam used when the welding is performed.

The lead frames 23 through 27 and the lead pins 29 may be subjected to Ni (nickel) plating on the surfaces thereof before they are encapsulated with resin. Accordingly, absorption efficiency of a laser beam at the weld parts can be increased. Alternatively, Au (gold) plating or Sn (tin) plating may be applied when the need arises.

Figure 5A:
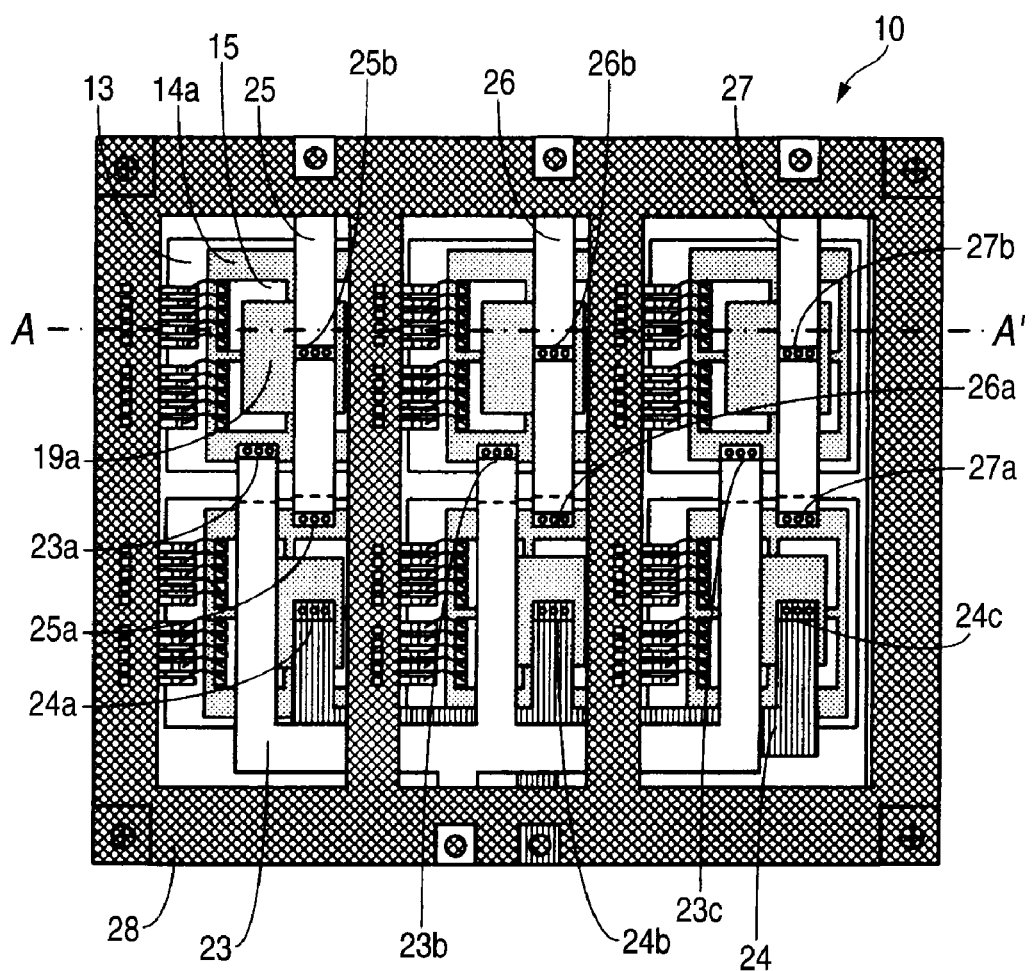
FIGS. 5A and 5B are schematic views of the major portion of the semiconductor device, FIG. 5A being a schematic top view of the major portion of the semiconductor device and FIG. 5B being a schematic cross section of the major portion used to describe a welded state of lead pins and terminals.
Figure 5B:
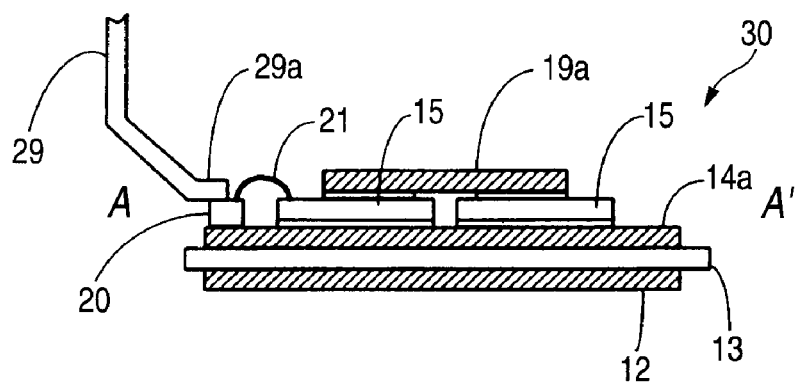

FIGS. 5A and 5B are schematic views of the major portion of the semiconductor device. FIG. 5A is a schematic top view of the major portion of the semiconductor device and FIG. 5B is a schematic cross section of the major portion used to describe a welded state of the lead pins and the terminals. Herein, FIG. 5B is an enlarged cross section of one power cell 30 and the lead frames and the resin case are omitted in the drawing. Also, FIG. 5B corresponds to the position of the cross section taken along line A-A' in FIG. 5A.

In order to encapsulate the periphery of the semiconductor device 10 with the resin case 28, the resin case 28 to which are fixed parts of the lead frames 23 through 27 and the lead pins 29 by resin is placed by being fit in the semiconductor device 10 shown in FIG. 3 so as to cover the semiconductor device 10 from above. The weld parts 23a, 23b, 23c, 24a, 24b, 24c, 25a, 25b, 26a, 26b, 27a, 27b, and 29a are then brought into contact with welded parts. At this stage, the respective weld parts provided to the lead frames 23 through 27 and lead pins 29 are disposed three-dimensionally so as to be exposed toward the laser light source used in the laser welding. Further, the lead frames 23, 25, 26, and 27 have the inclined structure as described above. Likewise, the lead pins 29 also have the inclined structure.

The weld parts and the welded parts are attached to each other by bonding as a laser beam is irradiated from a laser (for example, $Nd^{3+}YAG$ laser), for example, at three points on all the weld parts 23a, 23b, 23c, 24a, 24b, 24c, 25a, 25b, 26a, 26b, 27a, 27b, and 29a. Herein, the lead frames 23, 25, 26, and 27 and the lead pins 29 have the spring effect owing to the inclined structure. A specific load is therefore applied on the weld parts 23a, 23b, 23c, 25a, 25b, 26a, 26b, 27a, 27b, and 29a. Hence, even when the temperatures of the lead frames 23, 25, 26, and 27 and the lead pins 29 rise and slight deformation or the like occurs due to irradiation of a laser beam, it is possible to perform the welding in a reliable manner without the weld parts and the welded parts moving apart from each other during the welding.

When the bonding ends, the inside of the resin case 28 is filled with gel or epoxy resin and the resin case 28 is closed hermetically with a lid (not shown). The semiconductor device 10 is completed by the steps described above.

According to the manufacturing method of the semiconductor device as above, because all the weld parts 23a, 23b, 23c, 24a, 24b, 24c, 25a, 25b, 26a, 26b, 27a, 27b, and 29a are exposed toward the laser light source used in the laser welding when the bonding is performed, the welding is performed readily in a reliable manner, which in turn makes it possible to achieve a semiconductor device and a manufacturing method of the semiconductor device with high productivity. In particular, because all the weld parts 23a, 23b, 23c, 24a, 24b, 24c, 25a, 25b, 26a, 26b, 27a, 27b, and 29a are exposed when viewed from the top of the semiconductor device 10, a laser beam can be irradiated thereto continuously. It is thus possible to complete the welding in one step. As a result, the working process can be accelerated. To be more concrete, in comparison with a case where wires are used as the interconnections, the bonding time can be shorted to $1/30$ by performing the welding using the lead frames.

Incidentally, in a case where the thickness of the solders 17 and 18 shown in FIG. 1 varies or the Cu base 11 undergoes slight deformation due to a rise in temperature caused by irradiation of a laser beam during welding, the height from the Cu base 11 to the surfaces of the heat spreaders 19a, 19b, 19c, 19d, 19e, and 19f may possibly vary.

In such a case, the spring effect cannot be fully exerted only by the inclined structure of the lead frames 23, 25, 26, and 27 described above, and the weld parts and the welded parts may possibly move apart from each other when the welding is performed. Conversely, the load of the weld parts on the welded parts may possibly become excessively large, which consequently gives damages to the elements or the like.

Hence, in order to perform the welding in a more reliable manner, besides the inclined structure, it is necessary for the lead frame to have a structure such that reduces the rigidity thereof locally.

Figure 6A:
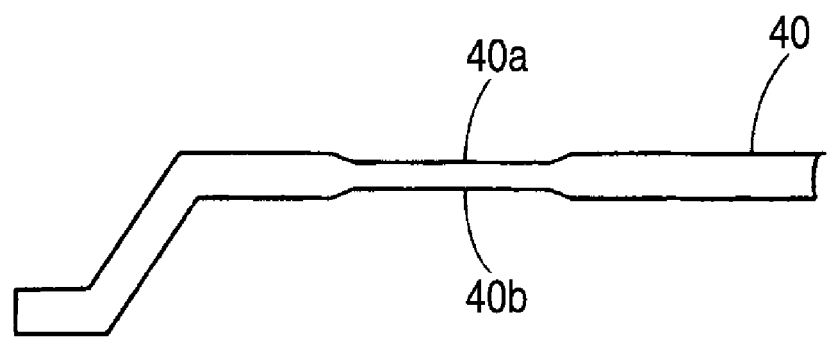
FIGS. 6A and 6B are schematic views of the major portion used to describe a first modification of the lead frame structure, FIG. 6A being a schematic side view of the major portion of the lead frame and FIG. 6B being a schematic three-dimensional view of the major portion.
Figure 6B:
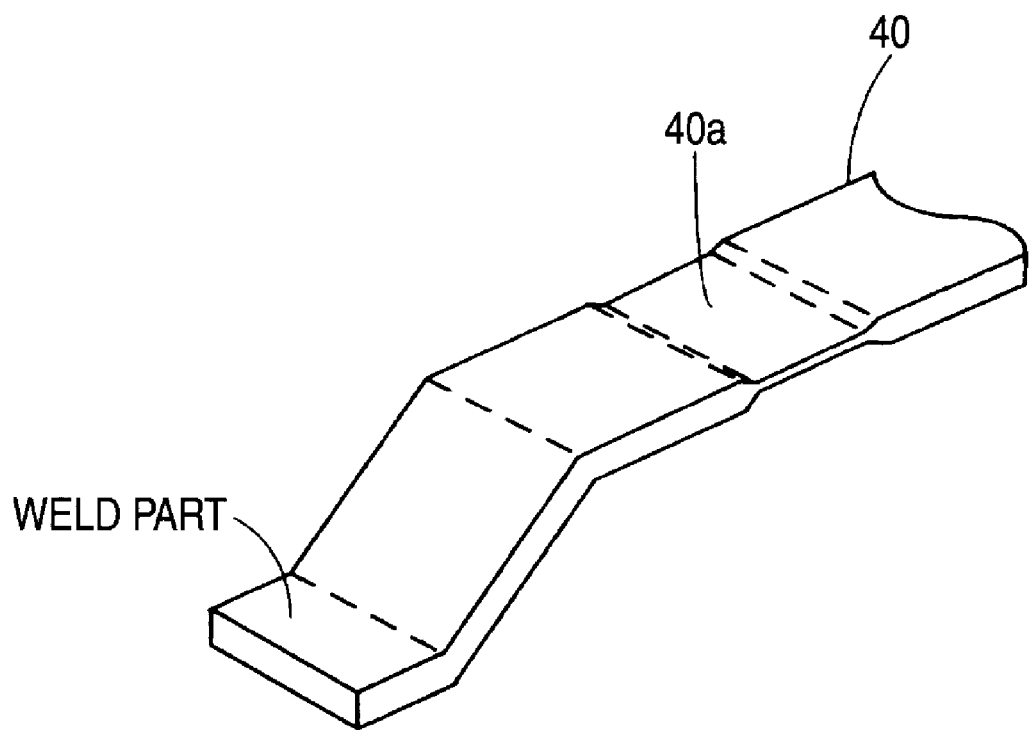

Hereinafter, the structure capable of reducing the rigidity of the lead frame locally will be described. FIGS. 6A and 6B are schematic views of the major portion used to describe a first modification of the lead frame structure. FIG. 6A is a schematic side view of the major portion of the lead frame and FIG. 6B is a three-dimensional schematic view of the major portion.

As are shown in these drawings, in order to reduce the thickness of a lead frame 40 in a part, a concave portion 40a or 40b is provided at least in the top surface or the bottom surface of the lead frame 40. When configured in this manner, it is possible to reduce the rigidity of the lead frame 40 locally.

Figure 7A:
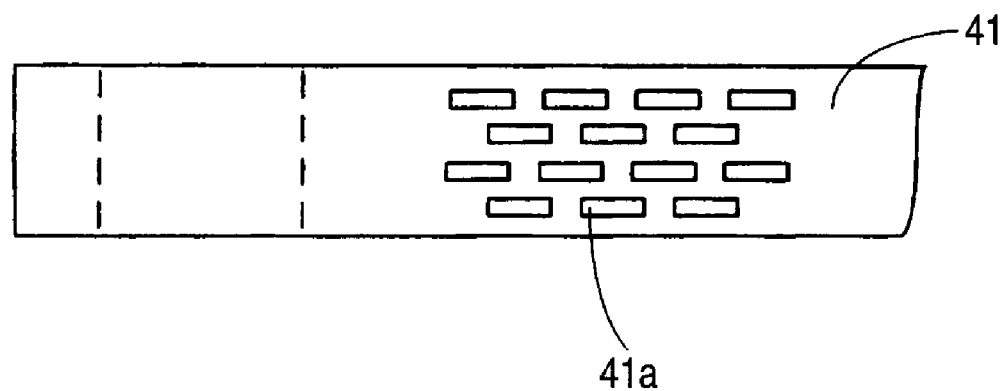
FIGS. 7A and 7B are schematic views of the major portion used to describe a second modification of the lead frame structure, FIG. 7A being a schematic side view of the major portion of the lead frame and FIG. 7B being a schematic three-dimensional view of the major portion.
Figure 7B:
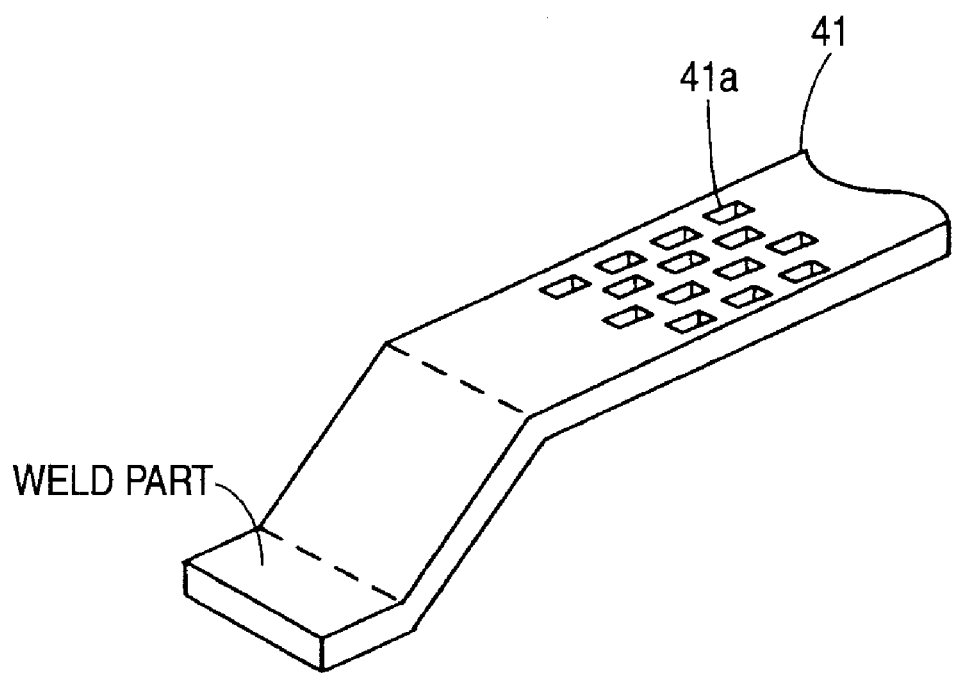

FIGS. 7A and 7B are schematic views of the major portion used to describe a second modification of the lead frame structure. FIG. 7A is a schematic side view of the major portion of the lead frame and FIG. 7B is a three-dimensional schematic view of the major portion.

As are shown in these drawings, at least one slit 41a penetrating through a part of a lead frame 41 is provided. When configured in this manner, it is possible to reduce the rigidity of the lead frame 41 locally.

Figure 8A:
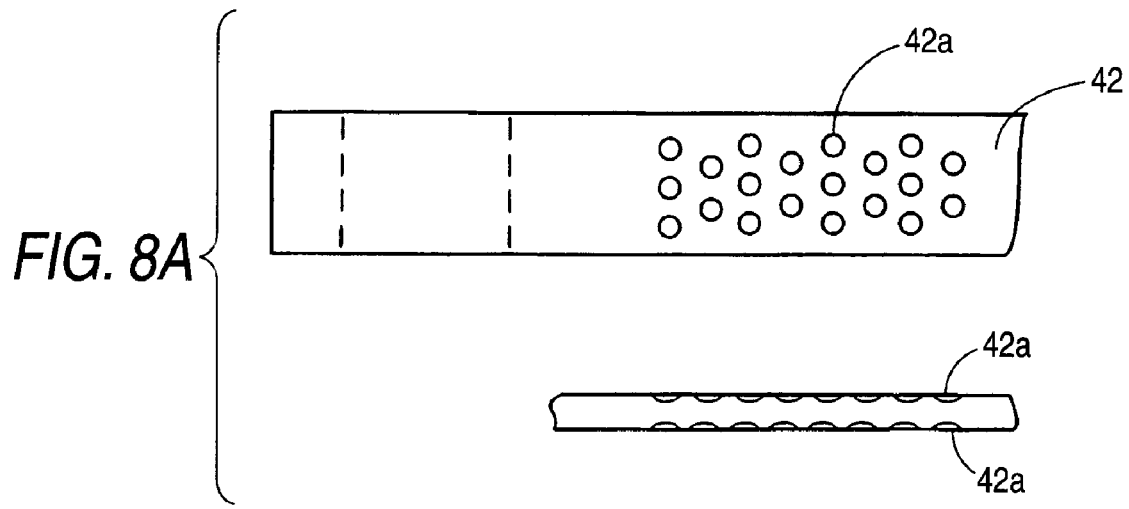
FIGS. 8A and 8B are schematic views of the major portion used to describe a third modification of the lead frame structure, FIG. 8A being a schematic side view of the major portion of the lead frame and FIG. 8B being a schematic three-dimensional view of the major portion.
Figure 8B:
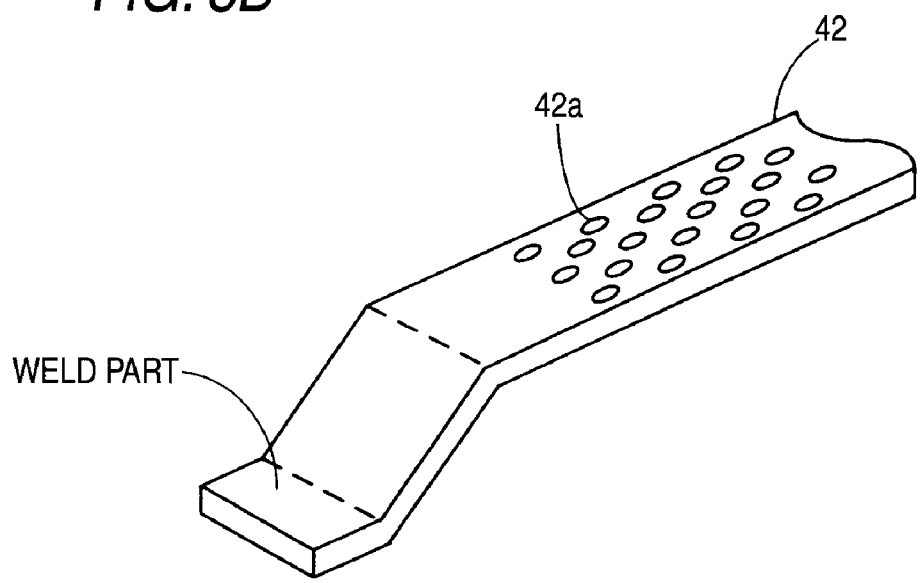

FIGS. 8A and 8B are schematic views of the major portion used to describe a third modification of the lead frame structure. FIG. 8A is a schematic side view of the major portion of the lead frame and FIG. 8B is a three-dimensional schematic view of the major portion.

As are shown in these drawings, at least one dimple 42a is provided in a part of a lead frame 42. The dimple 42a is formed at least in the top surface or the bottom surface of the lead frame 42. When configured in this manner, it is possible to reduce the rigidity of the lead frame 42 locally.

Figure 9A:
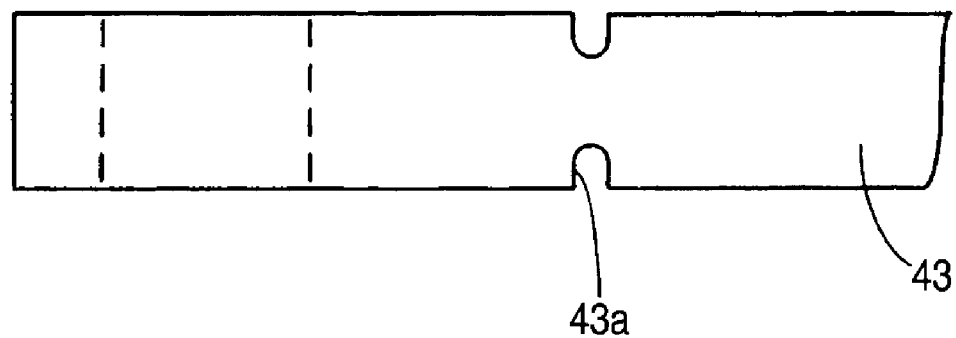
FIGS. 9A and 9B are schematic views of the major portion used to describe a fourth modification of the lead frame structure, FIG. 9A being a schematic side view of the major portion of the lead frame and FIG. 9B being a schematic three-dimensional view of the major portion.
Figure 9B:
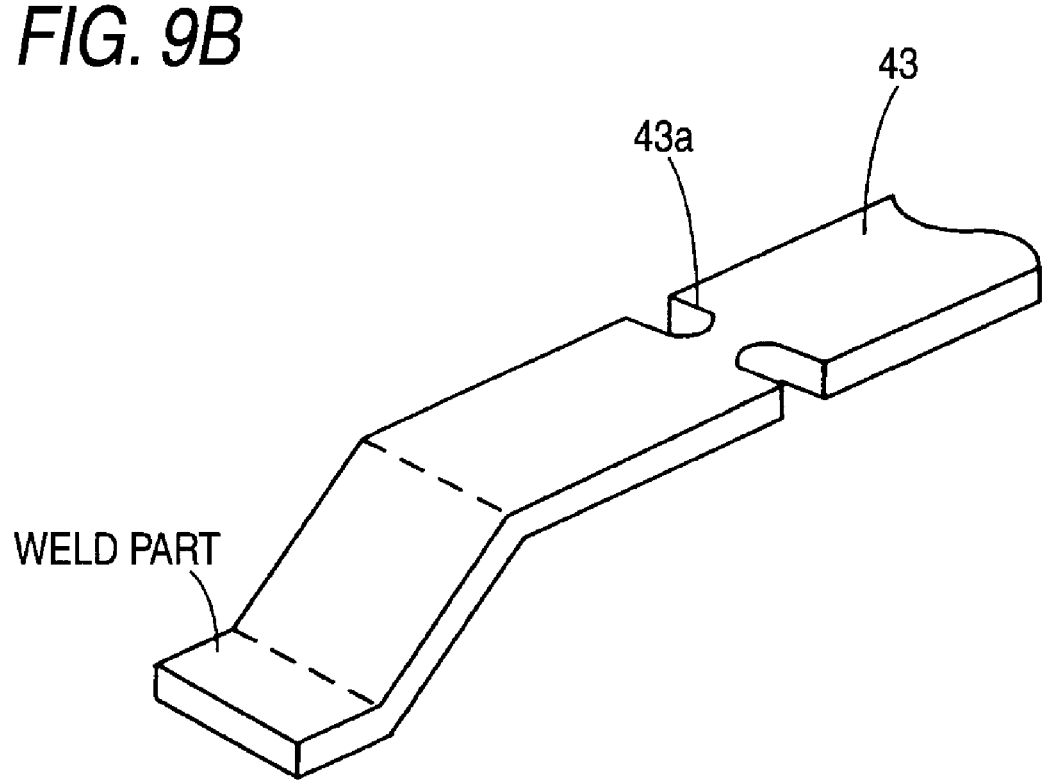

FIGS. 9A and 9B are schematic views of the major portion used to describe a fourth modification of the lead frame structure. FIG. 9A is a schematic side view of the major portion of the lead frame and FIG. 9B is a three-dimensional schematic view of the major portion.

As are shown in these drawings, a U-shaped neck portion 43a is provided in a part of the side surface of a lead frame 43. When configured in this manner, it is possible to reduce the rigidity of the lead frame 43 locally.

Figure 10A:
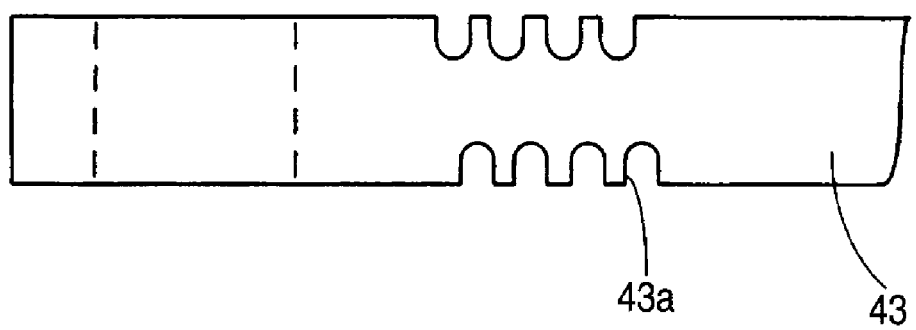
FIGS. 10A and 10B are schematic views of the major portion used to describe a fifth modification of the lead frame structure, FIG. 10A being a schematic side view of the major portion of the lead frame and FIG. 10B being a schematic three-dimensional view of the major portion.
Figure 10B:
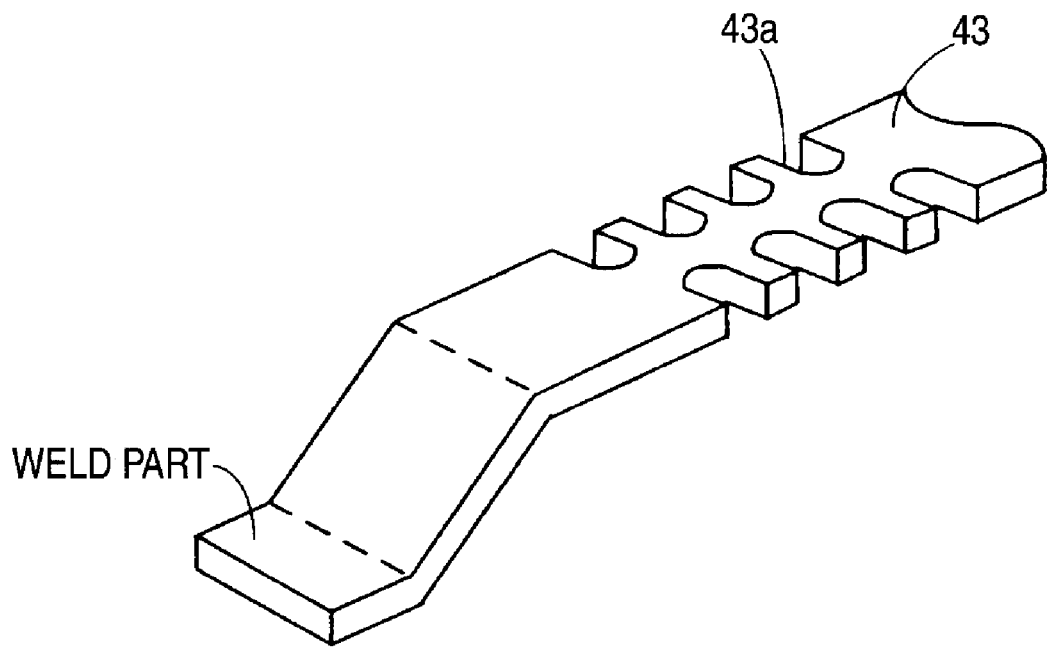

FIGS. 10A and 10B are schematic views of the major portion used to describe a fifth modification of the lead frame structure. FIG. 10A is a schematic side view of the major portion of the lead frame and FIG. 10B is a three-dimensional schematic view of the major portion.

As are shown in these drawings, at least one U-shaped neck portion 43a is provided in a part of the side surface of a lead frame 43. In particular, in a case where the neck portions 43a are provided in the both side surfaces of the lead frame 43, by shifting the phases of the allocated positions in the both side surfaces with each another instead of providing the neck portions 43a in the both side surfaces oppositely, not only is it possible to increase the elasticity, but it is also possible to reduce the rigidity of the lead frame 43 locally.

Figure 11A:
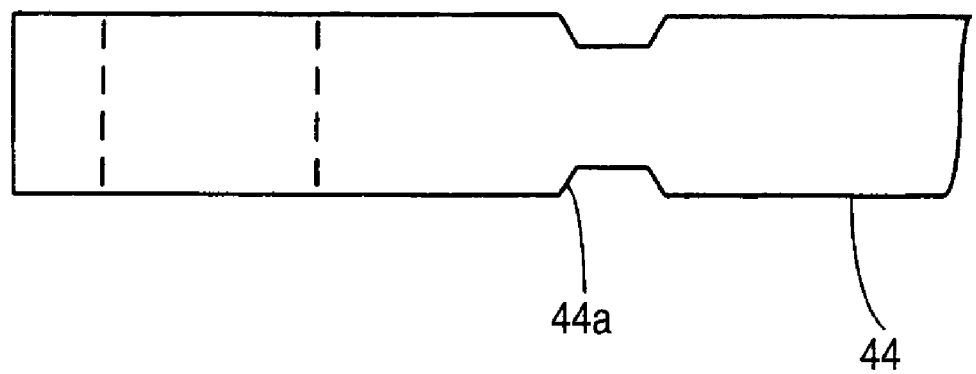
FIGS. 11A and 11B are schematic views of the major portion used to describe a sixth modification of the lead frame structure, FIG. 11A being a schematic side view of the major portion of the lead frame and FIG. 11B being a schematic three-dimensional view of the major portion.
Figure 11B:
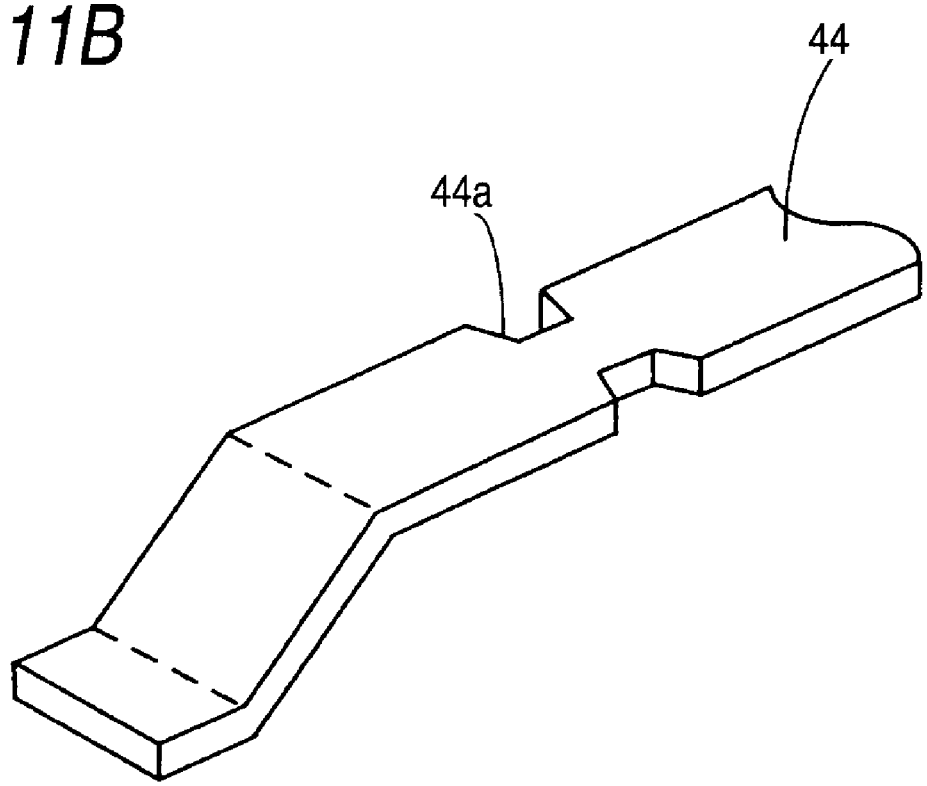

FIGS. 11A and 11B are schematic views of the major portion used to describe a sixth modification of the lead frame structure. FIG. 11A is a schematic side view of the major portion of the lead frame and FIG. 11B is a three-dimensional schematic view of the major portion.

As are shown in these drawings, at least one rectangular neck portion 44a is provided in part of the side surface of a lead frame 44. When configured in this manner, it is possible to reduce the rigidity of the lead frame 44 locally.

According to the structures of the lead frames as above, for example, even when the thickness of the solders 17 and 18 varies or the Cu base 11 undergoes slight deformation due to a rise in temperature during the welding, because the rigidity of the lead frames can be reduced locally, it is possible to perform the welding in a more reliable manner.

Also, according to the structures of the lead frames as above, by providing a portion that reduces the rigidity of the lead frame, it is possible to increase adhesion between the encapsulating resin and the lead frames when the inside of the semiconductor device 10 is encapsulated by filling resin therein.

Figure 12A:
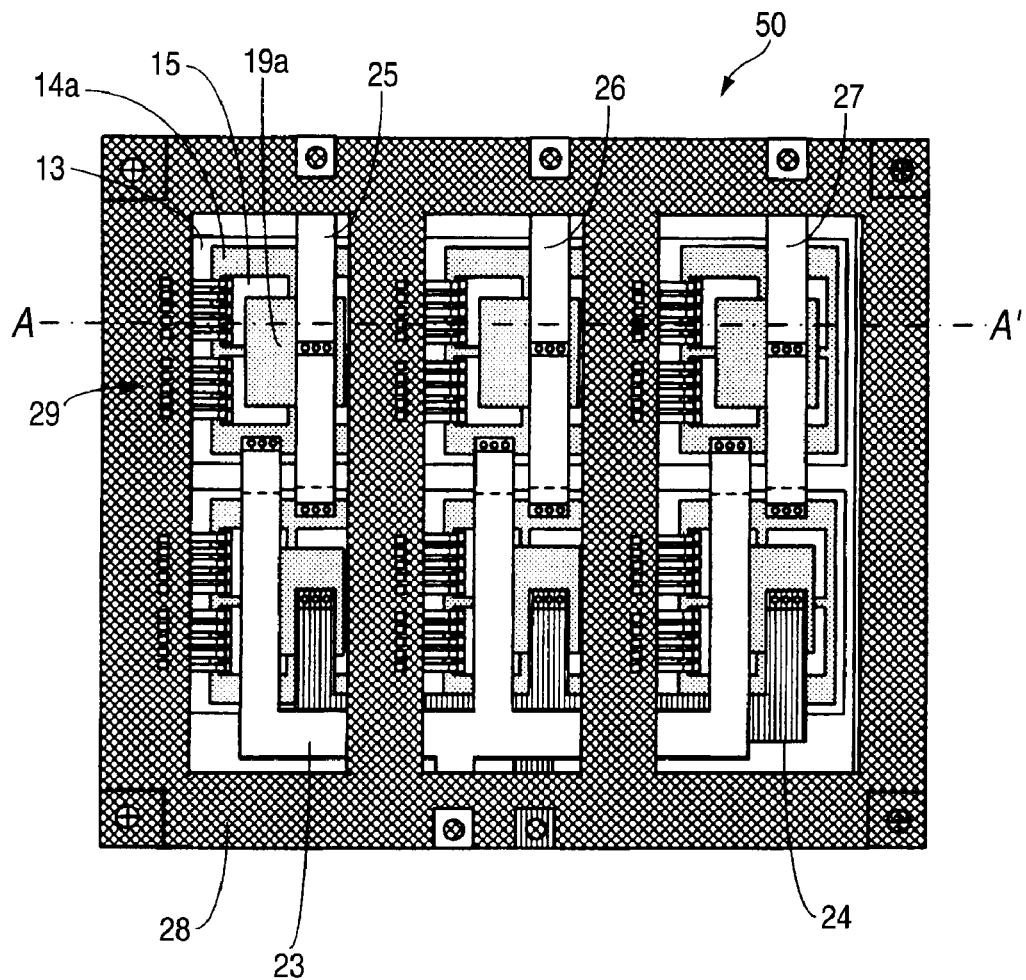
FIGS. 12A and 12B are schematic views of the major portion of a semiconductor device, FIG. 12A being a schematic top view of the major portion of the semiconductor device and FIG. 12B being a schematic cross section of the major portion used to describe a welded state of lead pins and terminals.
Figure 12B:
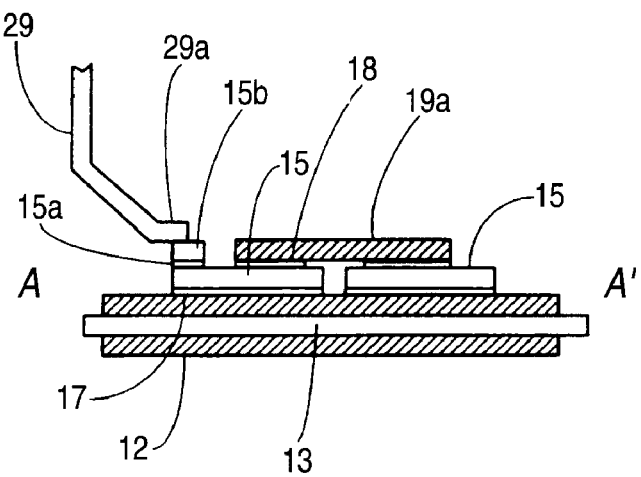

A semiconductor device in which the arrangement of the lead pins is modified will now be described. FIGS. 12A and 12B are schematic views of the major portion of the semiconductor device. FIG. 12A is a schematic top view of the semiconductor device and FIG. 12B is a schematic cross section of the major portion used to describe a welded state of the lead pins and the terminals. Herein, FIG. 12B is an enlarged cross section of one power cell, and the lead frames and the resin case are omitted in the drawing. Also, FIG. 12B corresponds to the position of the cross section taken along line A-A' in FIG. 12A. Like components are labeled with like reference numerals with respect to FIGS. 1A and 1B and FIG. 5A and FIG. 5B, and detailed descriptions thereof are omitted herein.

In this semiconductor device 50, metal terminal boards 15b are joined onto control electrode terminals (not shown) formed on each IGBT elements 15 via a solder 15a joined onto an Ni layer (not shown) on the surfaces of the control electrode terminals. The metal terminal boards 15b are made of, for example, Cu.

The lead pins 29 encapsulated in the resin case 28 are brought into direct contact with the metal terminal boards 15b provided on the IGBT element 15, and weld parts 29a of the lead pins 29 are welded to the metal terminal boards 15b through irradiation of a laser beam.

According to the semiconductor device 50 and the arrangement of the lead pins 29 as above, the step of forming the terminals on the insulating substrate 13 and the step of attaching the wires by bonding can be eliminated, which can in turn enhance the working efficiency. In addition, because the lead pins 29 can be welded directly to the metal terminal boards 15b provided on the IGBT element 15, it is possible to eliminate the need for a region where the terminals 20 are formed as is shown in FIG. 1. The size of the semiconductor device 50 can be thus reduced.

Incidentally, because a large number of the lead pins 29 are used, there may be a case where the working efficiency is deteriorated because of time and labor needed to encapsulate the lead pins 29 in the resin case 28 as described above with reference to FIG. 4B. Hence, there is proposed a lead pin unit in which plural lead pins are encapsulated with resin in advance.

Figure 13A:
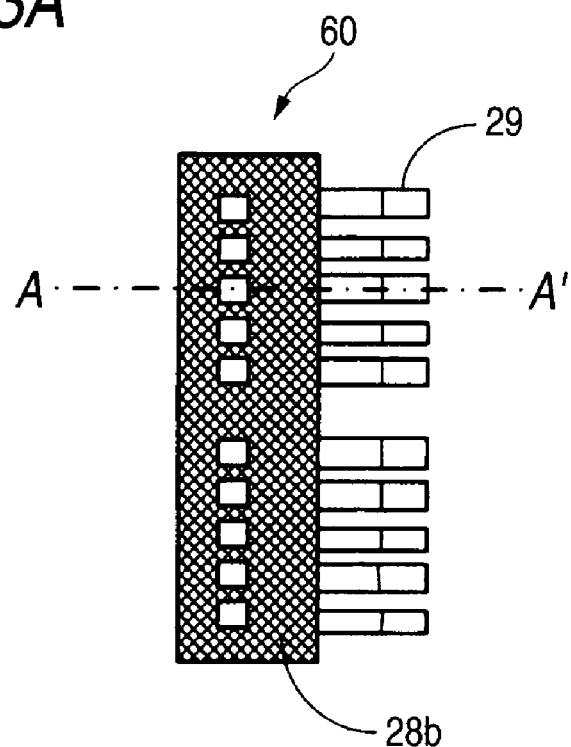
FIGS. 13A and 13B are schematic views of the major portion of a lead pin unit, FIG. 13A being a schematic top view of the major portion and FIG. 13B being a cross section of the major portion.
Figure 13B:
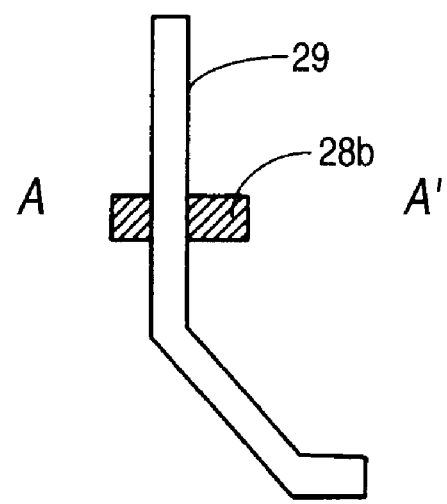

FIGS. 13A and 13B are schematic views of the major portion of the lead pin unit. FIG. 13A is a schematic top view of the major portion and FIG. 13B is a cross section of the major portion. Herein, FIG. 13B corresponds to the position of the cross section taken along line A-A' in FIG. 13A.

As are shown in these drawings, plural lead pins 29 are fixed as they are integrally encapsulated with resin 28b. A lead pin unit 60 encapsulated with the resin 28b is then fit in the resin case 28 at a predetermined position, and it is fixed to the resin case 28 by molding.

According to the lead pin unit 60 as above, time and labor needed to directly encapsulate the lead pins 29 in the resin case 28 can be saved, which can in turn enhance the working efficiency.

Also, regarding the metal terminal boards 15b to which the lead pins 29 are directly joined, a large number of them are used. Hence, it takes time and labor when the metal terminal boards 15b are individually joined onto the IGBT elements 15, and the working efficiency is deteriorated. To eliminate this inconvenience, a metal terminal board unit is formed, in which plural metal terminal boards 15b are encapsulated with an insulating material in advance.

Figure 14A:
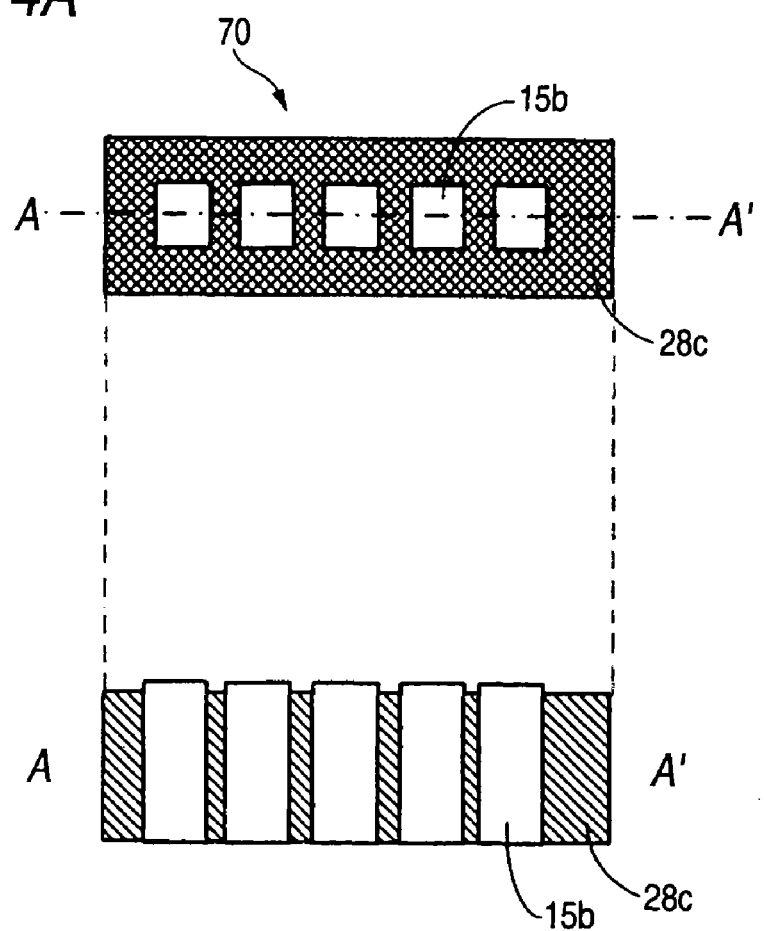
FIGS. 14A and 14B are schematic views of the major portion of a metal terminal board unit, FIG. 14A showing a schematic top view of the major portion and a cross section of the major portion of the metal terminal board unit and FIG. 14B being a schematic top view of the major portion used to describe a state where the metal terminal board unit is joined to an IGBT element.
Figure 14B:
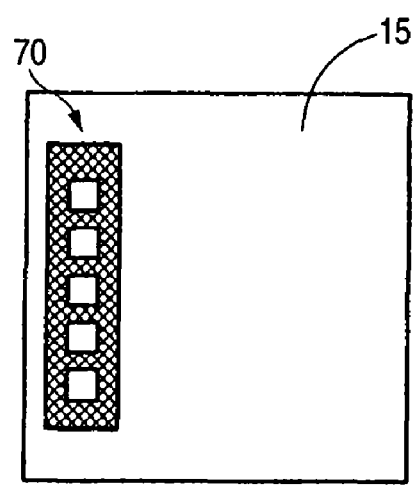

FIGS. 14A and 14B are schematic views of the major portion of the metal terminal board unit. FIG. 14A shows a schematic top view of the major portion and a cross section of the major portion of the metal terminal board unit and FIG. 14B is a schematic top view of the major portion used to describe a state where the metal terminal board unit is joined to the IGBT element.

As are shown in these drawings, plural metal terminal boards 15b are fixed as they are integrally encapsulated with an insulating material (herein, resin 28c). A metal terminal board unit 70 thus encapsulated is joined by soldering the metal terminal board unit 70 onto control electrode terminals (not shown) formed on the IGBT element 15.

According to the metal terminal board unit 70 as above, because time and labor needed to solder the metal terminal boards 15b individually onto the IGBT elements 15 can be saved, the working efficiency can be enhanced.

Figure 15:
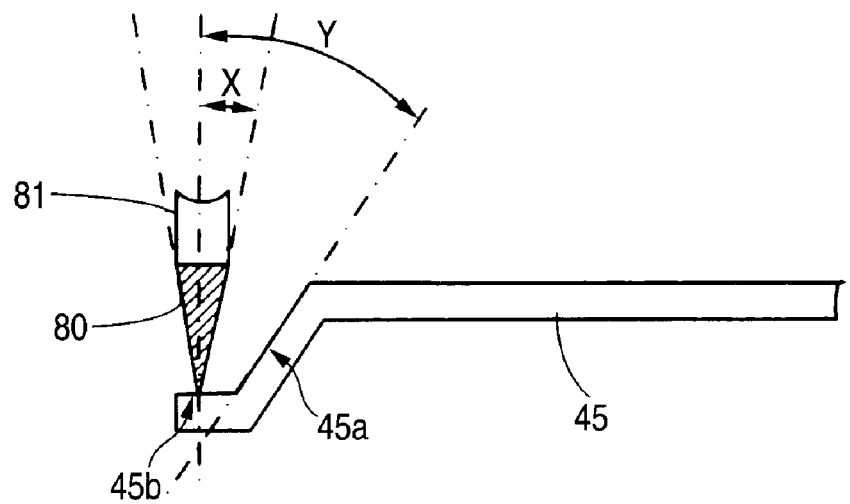
FIG. 15 is a schematic view used to describe the relation between the angle of aperture of a laser beam and the angle of the inclined structure of the lead frame.
Figure 15:
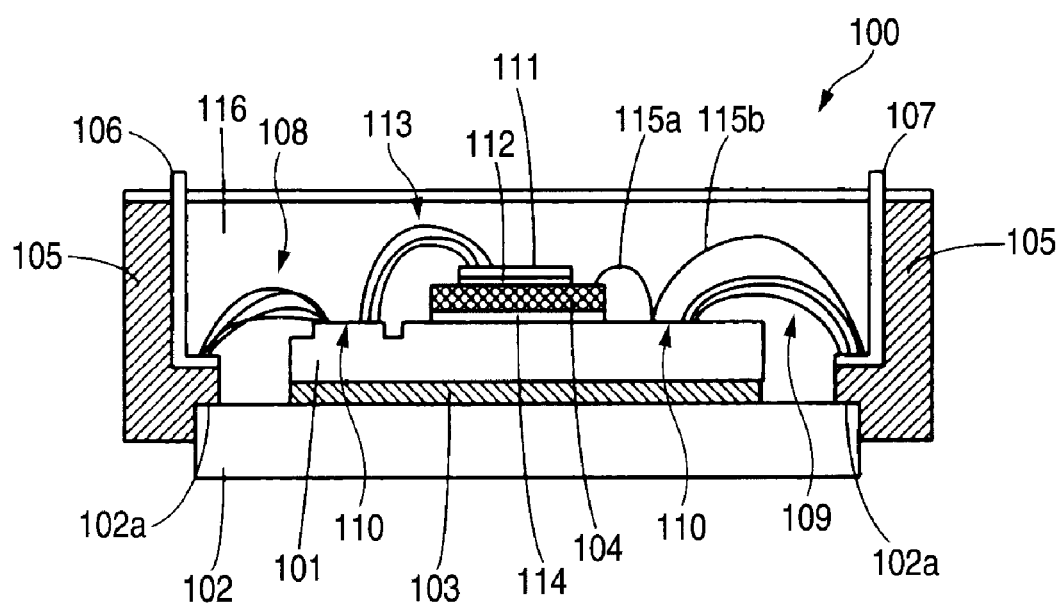

Finally, the relation between the angle of the inclined structure of the lead frame and the angle of aperture of a laser beam used in the welding will be described. FIG. 15 is a schematic view used to describe the relation between the angle of aperture of a laser beam and the angle of the inclined structure of the lead frame. As is shown in the drawing, the angle of inclination, Y, of a lead frame 45 causes the lead frame 45 to incline at an angle wider than the angle of aperture, X, of a laser beam to be irradiated. In other words, a part of the lead frame 45 other than the weld part 45b has a structure such that prevents irradiation by a laser beam. Hence, a laser beam 80 emitted from a laser unit 81 is not irradiated onto the inclined surface 45a of the lead frame 45. It is thus possible to prevent deformation of the lead frame 45 during welding caused by fusion and thermal expansion of the inclined surface 45a.

As has been described, the lead frame 45 is inclined, so that when a laser beam is irradiated onto the weld part 45b of the lead frame 45 formed of a conductor plate, the part other than the weld part 45b will not be irradiated by the laser beam. The same applies to the lead pins 29 described above.

The structure of the lead frame of the invention has been described above using the three-phase inverter as an example. It should be appreciated, however, that the semiconductor device provided with the lead frames of the invention is not particularly limited to the three-phase inverter. The invention is readily diverted to other power converters or the like formed of a semiconductor device.

What is claimed is:

1. A semiconductor device comprising:
   at least one semiconductor element; and
   plural conductor plates;
   wherein an electrical connection inside the semiconductor device is established by the plural conductor plates;
   wherein at least one of the conductor plates is laser welded at a weld part thereof to at least one of an electrode of the semiconductor element and a circuit pattern of a substrate on which the semiconductor element is mounted; and
   wherein the plural conductor plates are disposed three-dimensionally so that respective weld parts of the plural conductor plates are exposed to be accessible to a laser light source used in laser welding.

2. The semiconductor device according to claim 1, wherein:
   at least one of the plural conductor plates is an input conductor of the semiconductor device.

3. The semiconductor device according to claim 1, wherein:
   at least one of the plural conductor plate other than the weld part forms an inclined structure.

4. The semiconductor device according to claim 1, wherein:
   at least one of the conductor plates is inclined so that when a laser beam is irradiated onto the weld part of the conductor plate, the laser beam will not be irradiated to a part of the conductor plate other than the weld part.

5. The semiconductor device according to claim 1, wherein:
   a concave portion to provide a difference in thickness of the conductor plate is formed in at least one of a top surface and a bottom surface of the conductor plate.

6. The semiconductor device according to claim 1, wherein:
   at least one slit is formed in the conductor plate.

7. The semiconductor device according to claim 1, wherein:
   at least one dimple is formed in at least one of a top surface and a bottom surface of the conductor plate.

8. The semiconductor device according to claim 1, wherein:
   at least one U-shaped neck portion is formed in a side surface of the conductor plate.

9. The semiconductor device according to claim 1, wherein:
   at least one rectangular neck portion is formed in a side surface of the conductor plate.

10. The semiconductor device according to claim 1, wherein:
    at least one of the plural conductor plates is an output conductor of the semiconductor device.

11. The semiconductor device according to claim 10, wherein:
    the electrode of the semiconductor element is a heat spreader joined to an electrode layer of the semiconductor element.

12. The semiconductor device according to claim 1, wherein:
    the semiconductor device is encapsulated with resin.

13. The semiconductor device according to claim 12, wherein:
    a part of the conductor plate is fixed by the resin.

14. The semiconductor device according to claim 1, wherein:
    at least one of the plural conductor plates is a lead pin connected to a control terminal of the semiconductor element, and the lead pin is laser welded to a circuit pattern, electrically connected to the control terminal, of a substrate on which the semiconductor element is mounted.

15. The semiconductor device according to claim 14, wherein:
    the lead pin is provided in a plural form, and the lead pins are fixed integrally by resin to form a lead pin unit.

16. The semiconductor device according to claim 14, wherein:
    a metal terminal board is formed on the control terminal of the semiconductor element, and the lead pin is laser welded to the metal terminal board.

17. The semiconductor device according to claim 16, wherein:
    the metal terminal board is provided in a plural form, and the metal terminal boards are fixed integrally using an insulating material to form a metal terminal board unit.

18. A semiconductor device comprising:
    at least one semiconductor element; and
    plural conductor plates;
    wherein an electrical connection inside the semiconductor device is established by the plural conductor plates;
    wherein each of the conductor plates includes a plurality of weld parts; and
    wherein the plural conductor plates are disposed three-dimensionally so that the respective weld parts of the plural conductor plates are exposed.

19. A semiconductor device as claimed in claim 18, wherein at least one of the conductor plates includes means for providing rigidity in the conductor plate.

* * * * *